United States Patent
Fujimoto et al.

(10) Patent No.: US 6,243,945 B1
(45) Date of Patent: Jun. 12, 2001

(54) METHOD FOR MANUFACTURING ELECTRONIC PARTS

(75) Inventors: Isamu Fujimoto, Yasu-gun; Tohru Yaso, Shiga-ken; Tetsuo Tatsumi, Toyama, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/336,531

(22) Filed: Jun. 18, 1999

(30) Foreign Application Priority Data

Jul. 2, 1998 (JP) .................................................. 10-187242
Dec. 11, 1998 (JP) .................................................. 10-352951

(51) Int. Cl.⁷ ...................................................... H05K 3/30
(52) U.S. Cl. ................................ 29/841; 29/832; 29/855; 29/412; 83/929.1; 174/52.2; 264/272.17; 264/272.11; 264/157; 264/236; 264/347
(58) Field of Search ............................... 29/412–415, 832, 29/835, 837, 841, 855; 264/272.17, 272.11, 157, 236, 347; 83/929.1, 929.2; 174/52.2, 52.3, 52.4

(56) References Cited

U.S. PATENT DOCUMENTS

| | | | |
|---|---|---|---|
| 3,263,304 | * | 8/1966 | Falanga et al. .......................... 29/831 |
| 4,846,032 | * | 7/1989 | Jampathom et al. ...................... 83/51 |
| 5,635,115 | * | 6/1997 | Konishi et al. .................. 264/272.17 |
| 5,640,746 | * | 6/1997 | Knecht et al. .......................... 29/841 |
| 5,729,437 | * | 3/1998 | Hashimoto ........................... 174/52.1 |
| 5,732,465 | * | 3/1998 | Tokita et al. ............................ 29/841 |
| 5,907,477 | * | 5/1999 | Tuttle et al. ......................... 174/52.2 |

FOREIGN PATENT DOCUMENTS

| | | | | |
|---|---|---|---|---|
| 59-1034 | * | 1/1984 | (JP) ........................................ 29/412 |
| 393119 | * | 4/1991 | (JP) ........................................ 29/412 |

* cited by examiner

Primary Examiner—Lee Young
Assistant Examiner—Rick Kiltae Chang
(74) Attorney, Agent, or Firm—Ostrolenk, Faber, Gerb & Soffen, LLP

(57) ABSTRACT

The method of manufacturing electronic parts comprises the steps of: preparing a mother board; mounting element parts on the mother board; providing a thermosetting resin on a surface of the mother board surface on which the element parts are mounted; semi-curing the thermosetting resin so as to be in a range of a stage B condition of the thermosetting resin; splitting the mother board with the thermosetting resin into individual electronic parts each having a divided mother board, at least one element part and the thermosetting resin thereon; and heating the individual electronic parts so that the thermosetting resin in the stage B condition melts first and is then cured permanently.

15 Claims, 8 Drawing Sheets

METHOD FOR MANUFACTURING ELECTRONIC PARTS

BACKGROUND OF THE INVENTION

1. Field of the Invention

The present invention relates to an electronic part in which one or more semiconductor elements or the like are mounted on a substrate and sealed with the resin, and a method for manufacturing the same.

2. Description of the Related Art

A conventional electronic part and the method for manufacturing it will be explained with reference to FIGS. 9–13. In most commercial processes, a large number of electronic components are mounted on a relatively large mother board which is then cut into smaller pieces each defining a respective electronic component. A simple example of this process, but with only four electronic components being mounted on the mother board, will be described below.

As indicated in a perspective view of FIG. 9, a printed circuit board 111 in which through holes 112 are formed at the prescribed positions is prepared. Wiring patterns 113 are formed on a surface of the printed circuit board 111, and terminal electrodes 120 (FIG. 13) used for surface mounting are formed on a back side of the printed circuit board 111. The wiring patterns 113 are connected to the terminal electrodes 120 by respective electrodes 118 formed on an inner circumferential surface of respective through holes 112. The terminal electrodes 120, the wiring patterns 113, and the electrodes 118 on the inner circumferential surface of the through holes 112 are typically formed by plating gold on copper. The through holes 112 are filled with solder 119.

As indicated in FIG. 10, a semiconductor element 114 is die-attached to the printed circuit board 111 using epoxy resin or silver paste, and the semiconductor element 114 and the wiring pattern 113 are bonded to each other by a wire 115 of gold or the like. Then, a dam 116 (FIG. 11) is provided on a circumferential edge part of the printed circuit board 111 and a thermosetting epoxy resin 117 is applied to the surface of the printed circuit board 111 on which the semiconductor element 114 is mounted. Because the through holes 112 are filled with solder 119, the applied resin 117 does not enter the through holes 112. The resin 117 is then hardened through heating, cooling at a room temperature, irradiation of ultraviolet ray, or the like.

The printed circuit board is cut and split along lines passing approximately through center points of the through holes 112 by a dicing blade, and the electrode on the inner circumferential surface of the through holes 112 (as indicated in FIGS. 12, and 13) becomes a side electrode 118. In this way, a plurality of electronic parts, each including one or more electronic components which are mounted on a circuit board having a terminal electrode 120 on the back side thereof, are obtained.

In conventional electronic parts and in the conventional method for manufacturing those parts, the sealing resin is fully hardened before the mother board is split into smaller pieces. As a result, the resin is very hard when the electronic part is cut by the dicing blade. The inventors have discovered that this causes various problems. Specifically, if the dicing is carried out when the resin has been fully hardened, micro-cracks 122 (FIG. 14) can be formed in the resin by the impact of the dicing blade. When micro-cracks 122 are formed, larger cracks are caused as a result of water being absorbed in the micro-cracks 122 and the reliability of the electronic parts is degraded.

Also, in the conventional process after the sealing resin has hardened to its final degree of hardness, the filler and other elements added to the resin for the purpose of changing the coefficient of linear expansion of the resin is exposed in the cut section of the resin. In the condition where the filler, etc., is exposed in the cut section of the resin, the resin surface is in a rough condition having a large number of pores, and there is a problem that water is absorbed from the pores and the reliability of the electronic part is degraded.

In addition, the coefficient of linear expansion of the mother board is different from that of the sealing resin, and the resin shrinks when hardened. As a result, the mother board is warped when the resin is hardened as indicated in a simplified side view in FIG. 15. In the dicing process, it is necessary that the mother board and the resin be flat to achieve the correct dicing. Because the mother board is warped, the effectiveness of the dicing is suppressed.

SUMMARY OF THE INVENTION

The manufacturing method of the present invention comprises the steps of: semi-curing a thermosetting resin located on the surface of a mother board on which one or more electronic components are located to a stage B condition, at least some of the electronic components being encapsulated in the thermosetting resin; splitting the mother board into individual circuit boards, at least a plurality of the circuit boards having at least one electronic component encapsulated in the resin and mounted on the circuit board so as to form a plurality of electronic parts; and heating at least some of the individual electronic parts so that the thermosetting resin is first melted and is then permanently cured.

Since the mother board is split into individual electronic parts while the resin is in the stage B condition, the mother board is not warped when the splitting takes place. Further, since the mother board is split into individual electronic parts while the resin is in the stage B condition and the resin is subsequently permanently hardened to a final condition after the mother board is split into individual electronic parts, micro-cracks generated in splitting the mother board are removed when the resin is remelted in the process of permanently hardening the resin.

The heating step used to finally harden the resin may be so controlled that the thermosetting resin on the divided mother board melts to cover a portion of a side surface of the divided mother board. In the case, the resin surface is covered with a dense resin film, and the resistance against separation of the resin and the resistance against humidity are improved.

The manufacturing method of electronic parts may further comprises the step of providing a sheet on a surface of said resin before the semi-curing step. As a result, the surface of the resin can be made flat by the force such as the surface tension. This step is particularly useful when a suction device is used to mount the electronic parts.

The thermosetting resin providing on the surface of the mother board may be a pellet shape making the use of a dam unnecessary.

The electronic components may be arranged on the mother board in a matrix to facilitate the splitting process.

The manufacturing method may further comprises the step of arranging the individual electronic parts with intervals therebetween after the splitting step. This ensures that adjacent electronic parts will not be adhered to each other through re-melting of the resin.

An electronic parts according to the present invention comprises: a circuit board; at least one electronic component mounted on the circuit board; and a thermosetting resin provided on the surface of the circuit board so as to seal the at least one electronic component, the thermosetting resin having a top surface layer which has a density greater than the inside thereof. The thermosetting layer may cover a portion of a side surface of the circuit board.

BRIEF DESCRIPTION OF THE DRAWINGS

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, the preferred embodiments of the present invention are explained in detail with reference to the drawings wherein like numerals indicate like elements.

In practice, a large number of element components are mounted on a single mother board, which is then divided into a large number of smaller pieces, each including at least one electronic component. To simplify the description of the invention, the figures shown include only four electronic components mounted on the mother board. In practice, however, a greater number of electronic components are normally provided.

Figure 1:
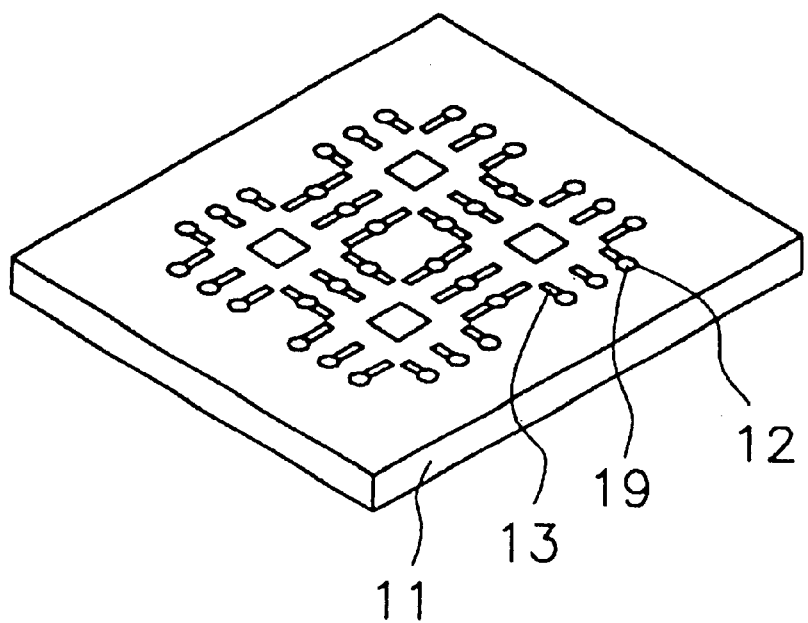
FIG. 1 is a perspective view illustrating one process of a manufacturing method of an electronic part in accordance with a first embodiment of the present invention.

First, a printed circuit board 11 having through holes 12 located at the prescribed positions as indicated in FIG. 1, is prepared. A wiring pattern 13 is formed on the surface of the printed circuit board 11, and terminal electrodes 20 (FIG.6) which are used for surface mounting are formed on a back side of the printed circuit board 11. Each wiring pattern 13 is connected to an associated terminal electrode 20 preferably through an associated electrode 18 formed on an inner circumferential surface 16 of a respective through hole 12. The electrode 18 on the inner circumferential surface of the through holes 12, the wiring pattern 13, and the terminal electrode 20 are preferably gold-plated on a copper material. In addition, the through holes 12 are filled with soldier 19. The printed circuit board 11 may consist of glass epoxy or other suitable materials such as aluminum and multi-layered dielectric material.

Figure 2:
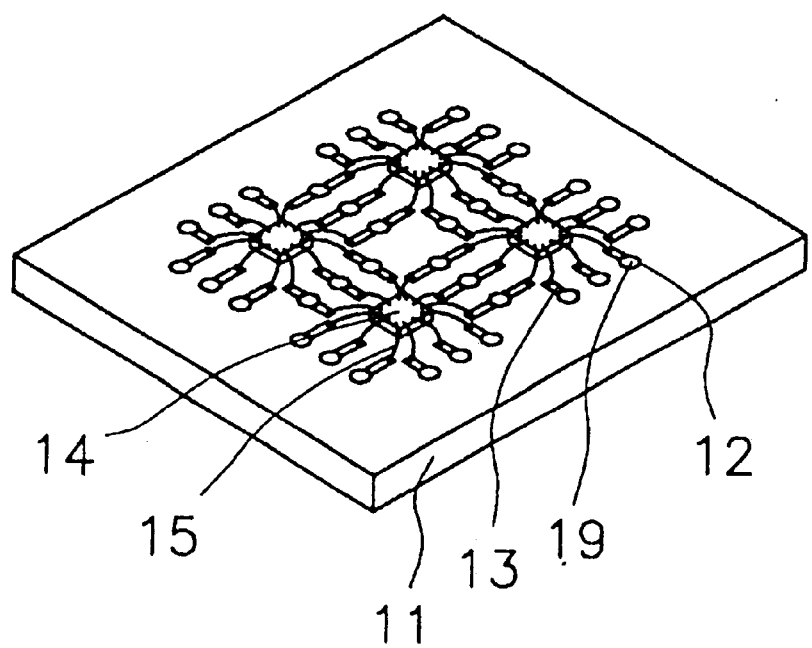
FIG. 2 is a perspective view illustrating one process of a manufacturing method of an electronic part in accordance with the first embodiment of the present invention.

As shown in FIG. 2, plurality of electronic components, such as semiconductor elements 14, are preferably die-attached to the printed circuit board 11 by any suitable material such as epoxy resin or silver paste. The semiconductors element 14 are bonded to the wiring patterns 13 using gold wires or the like. While the electronic components of the described embodiment are preferably semiconductor elements 14, other electronic components such as a capacitative element or an inductance element may be used.

Figure 3:
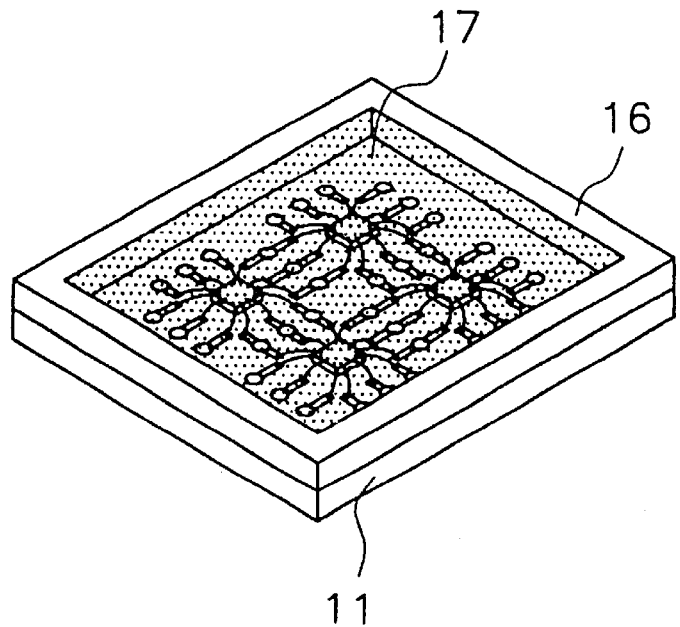
FIG. 3 is a perspective view illustrating one process of a manufacturing method of an electronic part in accordance with the first embodiment of the present invention.

A dam 16 is provided on a peripheral edge of the printed circuit board 11 as indicated in FIG. 3, and a thermosetting resin 17, such as epoxy resin, is applied to the surface of the printed circuit board 11 so as to encapsulate both the exposed portion of the upper surface of the printed circuit board 11 and the semiconductor elements 14. The resin 17 may be a matrix resin in which a filler is added. Because the through holes 12 are filled with soldier 19, the thermosetting resin 17 does not enter the through holes 12. While soldier is preferably used for this purpose, other materials may be used. For example, a resin which is soluble in alkaline aqueous solution may be used in which case the resin is solved with the alkaline aqueous solution in a subsequent process. Another suitable alternative is to fill the through holes 12 with a gold paste which is excellent in solder wettability. Other suitable alternatives are to adhere an insulating film to the openings of the through holes 12, or covering the through holes 12 with a solder resist.

Various thermosetting resins progressively move through stage A, stage B and stage C curing conditions. In stage A, the thermosetting resin is in an initial state and is uncured. In the stage B, the thermosetting resin is cured to a sufficient degree that it is no longer fluid but begins to upon the application of upon the application of further heat and is subsequently melted and cured again. Finally, in stage C, the thermosetting resin is completely cured and the resin reaches its final level of hardness.

In accordance with the preferred embodiment of the present invention, after the thermosetting resin 17 is applied to the printed circuit board, it is hardened through heating, etc., until it reaches the stage B condition where it is semi-cured. As known to those skilled in the art, this can be achieved by controlling the temperature and length of the curing process.

If the curing of the thermosetting resin 17 is stopped when the resin is in the stage B condition, no large shrinking force will be applied to the resin when the resin 17 is permanently hardened in stage C. As a result, the printed circuit board 11 will not be warped. A liquid thermosetting epoxy resin is preferably used as the sealing resin 17, but other resins such as an epoxy pellet capable of being formed in the required shape may also be used. If the pellet is formed in a shape to meet the size of the printed circuit board 11, use of the dam 16 can be dispensed with, and the number of members used in manufacturing process can be reduced.

After the resin is cured to the stage B condition, the printed circuit board 11 is preferably cut by a dicing blade along lines passing through approximately the center points of various through holes 12 to be split into smaller pieces, each containing one or more electronic parts. The splitting of the printed circuit board into smaller pieces may be achieved by other methods such as by breaking the board. If the thermosetting resin 17 is cured to stage B, the resin 17 will melt by the heat applied during the dicing process, and the dicing blade will not be severely loaded.

After the dicing process has been completed, the thermosetting resin 17 in the individual electronic parts is further cured by heating until the curing is completed and the resin reaches stage C. As the resin 17 melts, it will fill any micro-cracks which may have been formed during the dicing operation. In addition, after the dicing operation, the cut sections of the resin 17 are in a condition where the added filler, etc. is exposed, and the cut section of the resin 17 is in a rough condition where a large number of pores are present. However, the surface of the resin 17 is covered with a dense resin film when the resin 17 is melted during the final curing process. Therefore, it is difficult for water to be absorbed from the surface of the resin 17, and the reliability of the electronic parts is improved.

Figure 4:
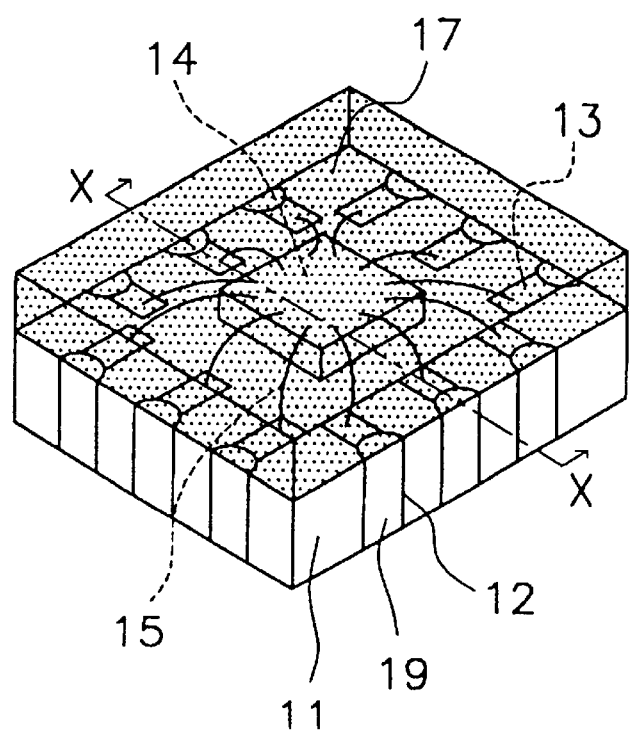
FIG. 4 is a perspective view illustrating an electronic part to be obtained by the manufacturing method of the present invention.
Figure 5:
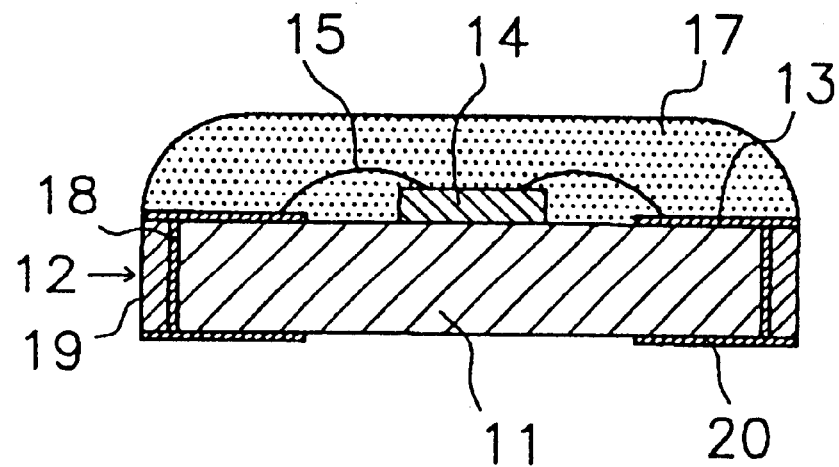
FIG. 5 is a sectional view taken along the line 5—5 of FIG. 4.
Figure 6:
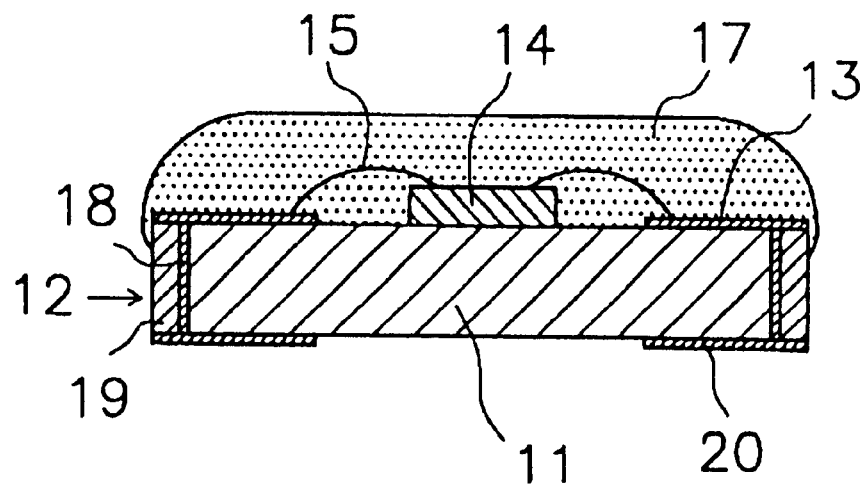
FIG. 6 is a perspective view illustrating another electronic parts to be obtained by the manufacturing method of the present invention.

The electrode on the inner circumferential surface of the through holes 12 where the electronic part has been cut is best shown in FIG. 4 and in FIG. 5. These electrodes become side electrodes 18, and an electronic part having a terminal electrode 20 on its back side is obtained. By controlling the time period in which heat is applied to the resin 17 to permanently harden the resin (i.e., to bring it to stage C), it is possible to ensure that the resin sags over a portion of the side electrodes 18 as shown in FIG. 6. This has the desired effect of strengthening the connection between the resin 17 and the printed circuit board 11 and eliminating the absorption of water from the edge parts of the substrate. This improves the resistance of the electronic parts against the humidity.

A second embodiment of the electronic part and method for manufacturing the same in accordance with the principles of the present invention are described with reference to FIGS. 7 and 8. The explanation is same as that of the first embodiment in general, the same symbols are attached to the same elements as those of the previous embodiment and only the elements specific to the second embodiment are described.

Figure 7:
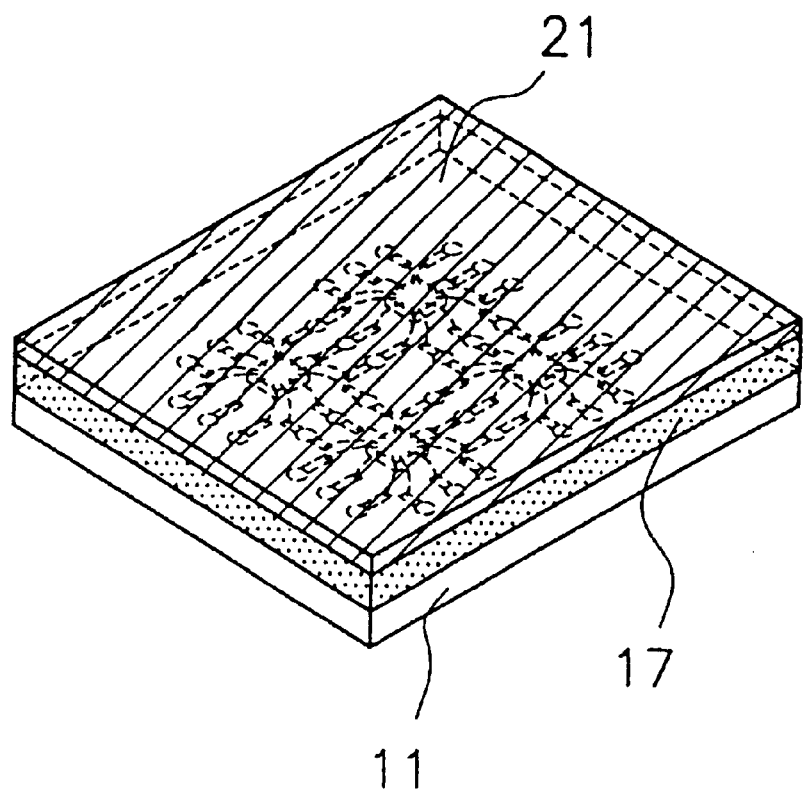
FIG. 7 is a perspective view illustrating one process of a manufacturing method of an electronic part according to a second embodiment of the present invention.
Figure 8:
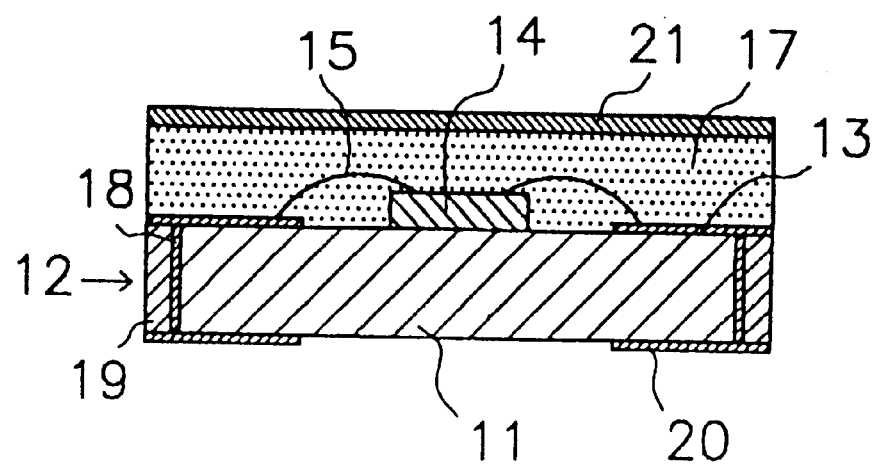
FIG. 8 is a sectional view illustrating one process of a manufacturing method of an electronic part according to the second embodiment of the present invention.
Figure 9:
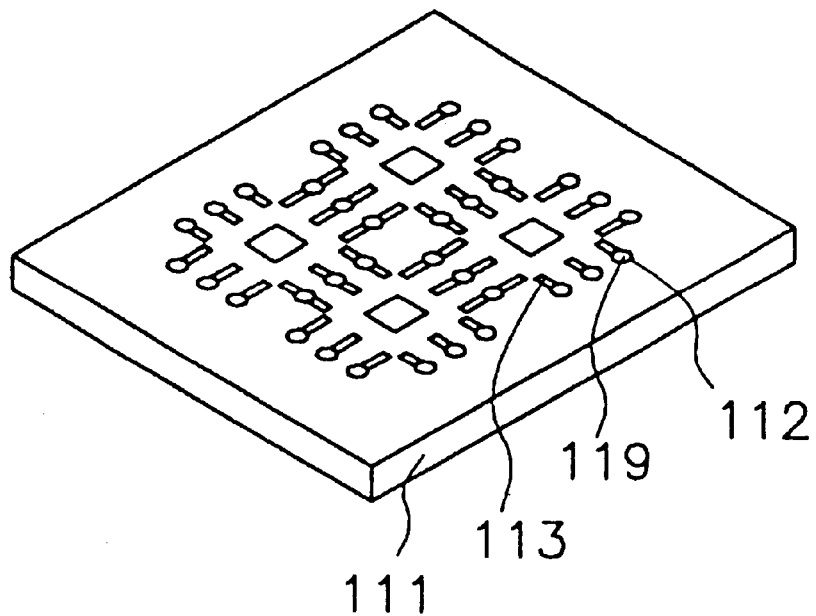
FIG. 9 is a perspective view illustrating one process of a manufacturing method of a conventional electronic part.
Figure 10:
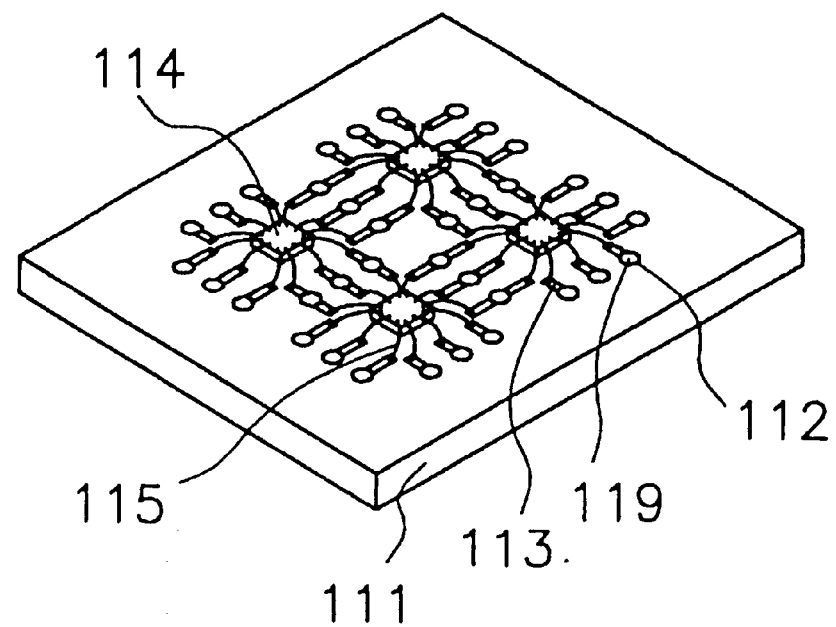
FIG. 10 is a perspective view illustrating one process of a manufacturing method of a conventional electronic part.
Figure 11:
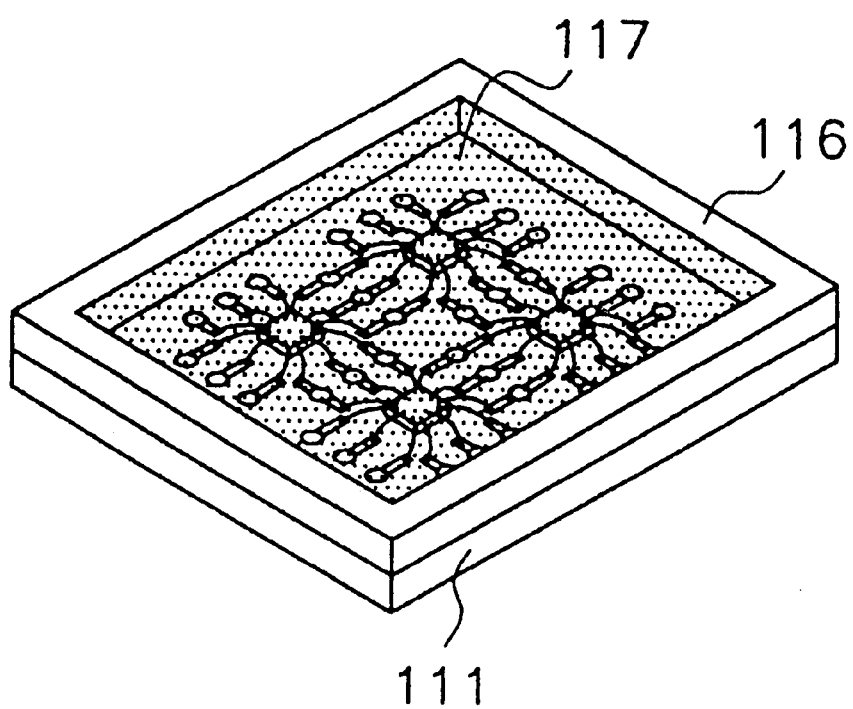
FIG. 11 is a perspective view illustrating one process of a manufacturing method of a conventional electronic part.
Figure 12:
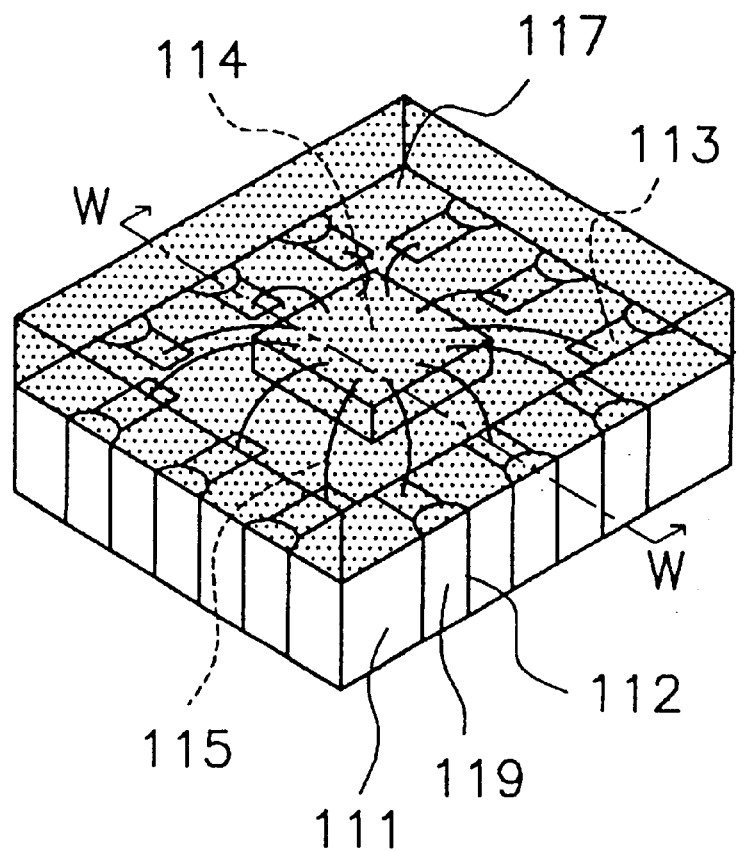
FIG. 12 is a perspective view illustrating an electronic part to be obtained by a manufacturing method of a conventional electronic part.
Figure 13:
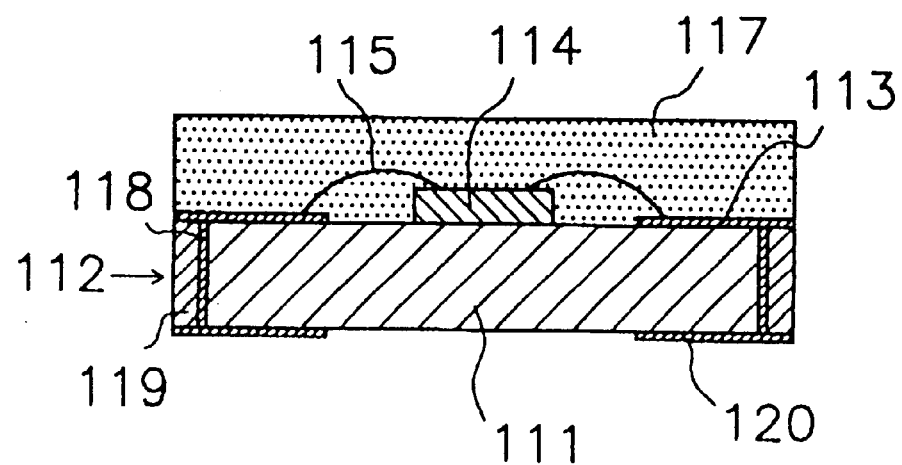
FIG. 13 is a sectional view taken along the line 13—13 of FIG. 12.
Figure 14:
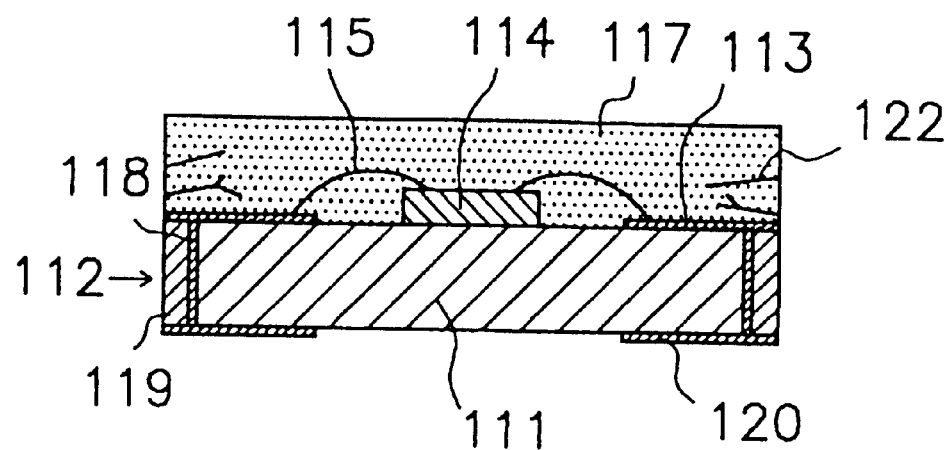
FIG. 14 is a sectional view illustrating an electronic part in which micro-cracks are generated to be obtained by a manufacturing method of a conventional electronic part.
Figure 15:
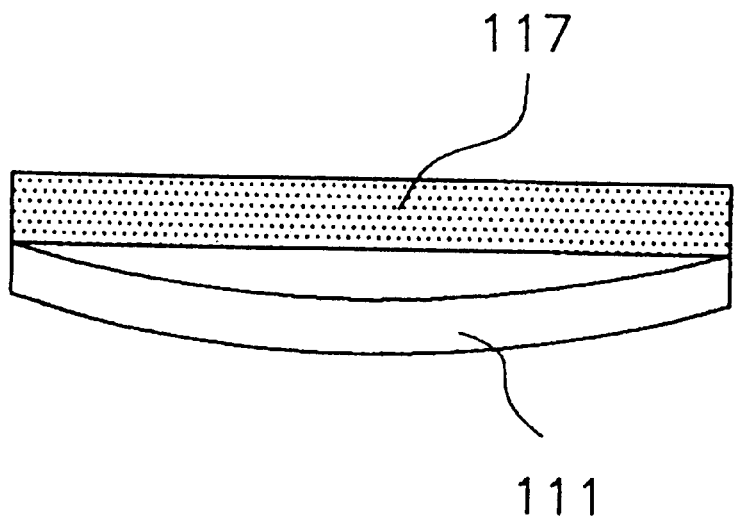
FIG. 15 is a simplified side view illustrating the warp of a substrate.

In this embodiment, the sealing thermosetting epoxy resin 17 is applied to the printed circuit board 11 on which the semiconductor element 14 are mounted, and then, a sheet 21, consisting of the resin or the like, is carefully applied to cover the surface of the sealing resin 17 so that no bubbles are contained in a top surface of the applied resin 17 as indicated in FIG. 7. Then, the sealing resin 17 is heated to the stage B condition. In the electronic part to be obtained through this process, the surface of the sealing resin 17 becomes flat as indicated in the sectional view of FIG. 8 by the sheet 21 consisting of the resin. This embodiment is particularly useful when a suction device or the like is to be used in the mounting of the electronic component. While sheet 21 preferably consists of resin or the like, other materials such as a non-woven fabric consisting of glass fiber may be used. Also, a pellet of thermosetting epoxy resin on which a sheet of resin is applied or with which a non-woven fabric is impregnated may be placed on the mother board and heated to be hardened.

In the disclosed embodiments, the printed circuit board have through holes formed therein. However, the invention is not so limited. For example, the terminal structure to be used in the connection to the outside may be of LGA type or BGA type. The present invention may be applied to any system where the mother board is split into smaller pieces to obtain individual pieces electronic components.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of manufacturing electronic parts, the method comprising:
    semi-curing a thermosetting resin located on a surface of a mother board on which one or more electronic components are located to a stage B condition, at least some of the electronic components being encapsulated in the thermosetting resin;
    splitting the mother board into individual circuit boards, at least two of the circuit boards having at least one of said electronic components encapsulated in the resin and mounted on the circuit board so as to form a plurality of electronic parts; and
    heating at least some of the electronic parts so that the thermosetting resin on the heated electronic parts is first melted and is then permanently cured.

2. The method according to claim 1, wherein each of the individual circuit boards has at least one to the electronic components located thereon, the at least one of the electronic components being encapsulated in the resin.

3. The method according to claim 2, wherein the heating step is applied to each of the electronic parts.

4. The method according to claim 3, wherein, for each of the electronic parts, the heating step is carried out at a temperature and over a time period which causes the thermosetting resin to melt and cover at least a portion of a side surface of the individual circuit boards.

5. The method according to claim 4, wherein the heating step is applied to all of the electronic parts simultaneously.

6. The method according to claim 3, further including a step of providing a sheet on an exposed surface of the resin before the semi-curing step.

7. The method according to claim 1, wherein the heating step is applied to each of the electronic parts.

8. The method according to claim 1, further including steps of:

mounting a plurality of electronic components on the surface of the mother board prior to the semi-curing step; and providing the thermosetting resin on the surface of the mother board and encapsulating at least some of the electronic components after the mounting step but before the semi-curing step.

9. The method according to claim 8, further including a step of preparing the mother board prior to the mounting step.

10. The method according to claim 8, wherein the thermosetting resin provided on the surface of the mother board is a pellet shape.

11. The method according to claim 1, wherein, for each of the electronic parts, the heating step is carried out at a temperature and over a time period which causes the thermosetting resin to melt and cover at least a portion of a side surface of the individual circuit boards.

12. The method according to claim 11, wherein the heating step is applied to all of the electronic parts simultaneously.

13. The method according to claim 1, further including a step of providing a sheet on an exposed surface of the resin before the semi-curing step.

14. The method according to claim 1, wherein the electronic components are arranged on the mother board in a matrix.

15. The method according to claim 1, further comprising a step of separating the electronic parts with intervals therebetween after the splitting step and before the heating step.

* * * * *